United States Patent [19]

Becker et al.

[11] 4,370,182
[45] Jan. 25, 1983

[54] METHOD OF MAKING TAPE TRANSDUCER

[75] Inventors: Jon Becker, Milpitas; Kirby G. Miller, Saratoga; Charles F. Burney, Orland, all of Calif.

[73] Assignee: GTE Products Corporation, Stamford, Conn.

[21] Appl. No.: 331,490

[22] Filed: Dec. 17, 1981

Related U.S. Application Data

[62] Division of Ser. No. 244,491, Mar. 16, 1981, Pat. No. 4,344,810.

[51] Int. Cl.³ .................. H01B 13/10; H01B 13/26
[52] U.S. Cl. .................................. 156/52; 29/25.35; 29/594; 29/602 A; 156/164; 156/229; 156/273.1; 156/273.3; 156/273.9; 156/274.6; 156/308.2; 156/322; 156/324; 156/379.7; 156/380.3; 156/495; 156/554; 307/400; 310/800

[58] Field of Search .............. 156/52, 164, 229, 273.1, 156/273.3, 273.9, 274.6, 308.2, 324, 379.5, 383.3, 495, 554; 29/594, 602, 25.35; 307/400; 310/800

[56] References Cited

U.S. PATENT DOCUMENTS

| 3,544,733 | 12/1970 | Reylek | 29/594 |
| 3,940,974 | 3/1976 | Taylor | 307/400 |
| 4,137,116 | 1/1979 | Miller | 156/324 |
| 4,173,659 | 11/1979 | DuBois et al. | 307/400 |
| 4,250,415 | 2/1981 | Lewiner et al. | 307/400 |
| 4,310,365 | 1/1982 | Elliott et al. | 156/324 |
| 4,322,877 | 4/1982 | Taylor | 29/594 |

Primary Examiner—Jerome W. Massie
Attorney, Agent, or Firm—John F. Lawler

[57] ABSTRACT

A method of continuously making a composite tape transducer consisting of the steps of electrically charging dielectric layers on opposite sides of a conductive inner strip to form electrets, applying wider outer laminates symmetrically to opposite sides of the electret-covered inner strip and sealing together the marginal edge portions of the outer laminates to enclose the electret-covered inner strip.

4 Claims, 15 Drawing Figures

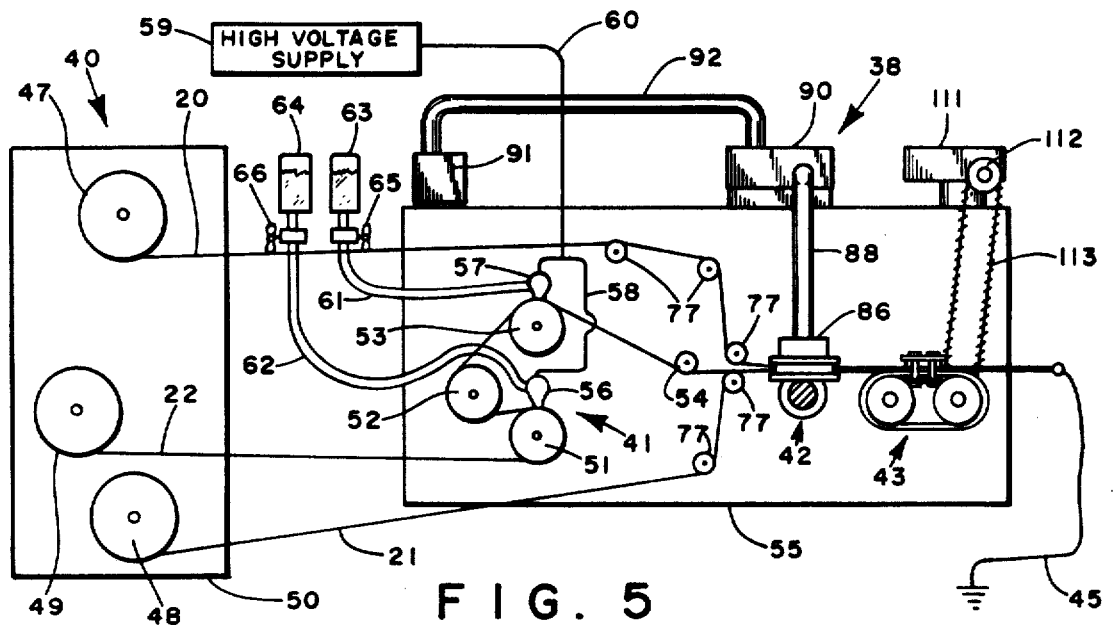
FIG. 5
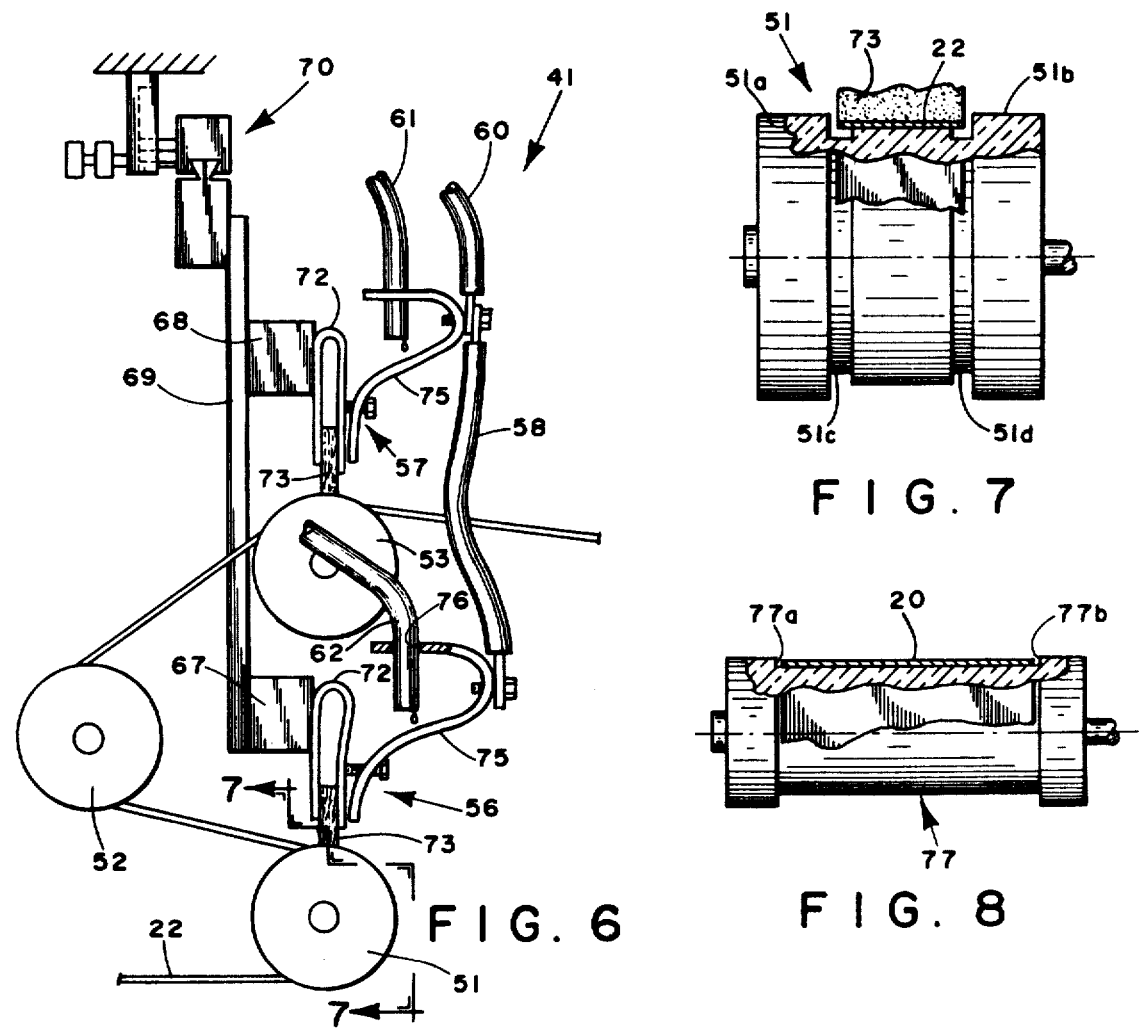
FIG. 6
FIG. 7
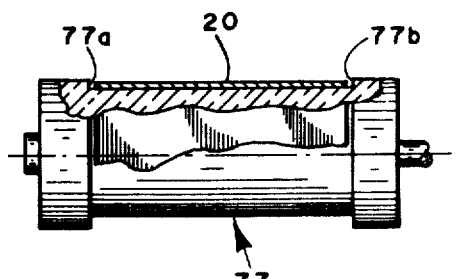
FIG. 8

METHOD OF MAKING TAPE TRANSDUCER

This is a division of application Ser. No. 244,491, filed Mar. 16, 1981, now U.S. Pat. No. 4,344,810.

RELATED APPLICATION

Ser. No. 244,492 filed Mar. 16, 1981.

BACKGROUND OF THE INVENTION

This invention was made under a contract with the Department of the Air Force.

This invention relates to a method of making a flexible tape transducer.

The electret tape transducer described in patent 4,023,155 has the advantages of being flat, flexible and of providing unidirectional object detection capability so that it operates both as an active and as a passive transducer. This tape transducer, however, has a disadvantage in that proper electrical shielding requires that a conducting strip be located on the side of the inner conducting strip opposite from the moving conducting strip and be electrically connected to the latter along its marginal edges. For purposes of discussion, this transducer design can be considered as an upper portion and a lower portion with the inner conducting strip on the boundary between them. The upper portion provides the transduction function while the lower portion is inactive. However, since the basic transducer when used to detect vibrations is a charge generator and since the inactive capacitance of the lower portion is in parallel with that of the active portion, the output voltage of the transducer is reduced by the presence of the shielding strip. For example, if the active and inactive capacitances are equal, the output voltage of the transducer is reduced by 6 dB.

The inactive capacitance may be reduced to a negligible amount by sufficiently increasing the spacing between the shielding strip and the inner strip and by using as a spacer a low dielectric constant material such as plastic foam. The difficulty with this approach is that the thickness of the tape transducer is substantially increased and the flexibility and rollability of the device are substantially reduced. Both of these results are undesirable and in some cases unacceptable. Another disadvantage of this design is the requirement that the center strip have high inertia relative to that of the moving strip. This requirement is achieved by using a thick, heavy metal tape which increases the cost of the transducer.

A tape transducer which overcomes these disadvantages and, without sacrificing performance, retains shielding and the desired mechanical characteristics of flexibility and has a very thin profile is described in copending application Ser. No. 244,492 by Miller et al, assigned to the assignee of this invention. The improved transducer utilizes two active lay strips instead of one. Both insulating layers between the center strip and outer strips are poled to form electrets. Any motion of the outer strips with respect to the electrets produces an electrical signal output across the outer and inner strips. By poling the electret layers symmetrically with respect to the center strip, reduction of the spacing from either or both outer strips to the center strip produces the same polarity signal and thus the device is sensitive to pressure.

A further advantage of this improved tape transducer occurs in the radiation mode, i.e., when the tape is energized to produce sonic or ultrasonic waves. When a voltage is applied between the center and outer strips, forces are produced on both sides of the center strip that are symmetrical with respect to it. Thus the electrically reactive force enables the use of a thinner, lighter center strip with savings of cost and weight. Moreover the need for dielectric foam or the like for spacing one of the outer strips from the center strip is eliminated thus providing a thin flexible transducer that is easy to handle and occupies minimum space.

This invention is directed to a method of making this improved tape transducer.

OBJECTS AND SUMMARY OF THE INVENTION

A general object of this invention is the provision of a method of continuously making an improved tape transducer.

These and other objects of the invention are achieved with a method of continuously making the transducer by charging opposite sides of a dielectric covered center conducting strip, applying two outer conducting strips to opposite sides of the center strip and sealing the marginal edge portions of the outer strips together, and frictionally engaging the marginal edge portions of the outer strips to continuously move the strips as the foregoing operations are performed.

DESCRIPTION OF THE DRAWINGS

FIG. 5 is a schematic elevational view of the transducer making apparatus embodying this invention.

FIG. 6 is an enlarged elevational view of the dielectric charging station forming part of the apparatus of FIG. 5.

FIG. 7 is an enlarged partially sectioned view of one if the electrode assemblies, the view being taken on line 7—7 of FIG. 6.

FIG. 8 is a view similar to FIG. 7 showing one of the guide rollers for the outer laminates.

DESCRIPTION OF PREFERRED EMBODIMENT

An electret tape transducer of the type with which this invention is concerned is useful, for example, for transmitting and for receiving ultrasonic waves in an intrusion detection system described in U.S. Pat. No.

Figure 1:
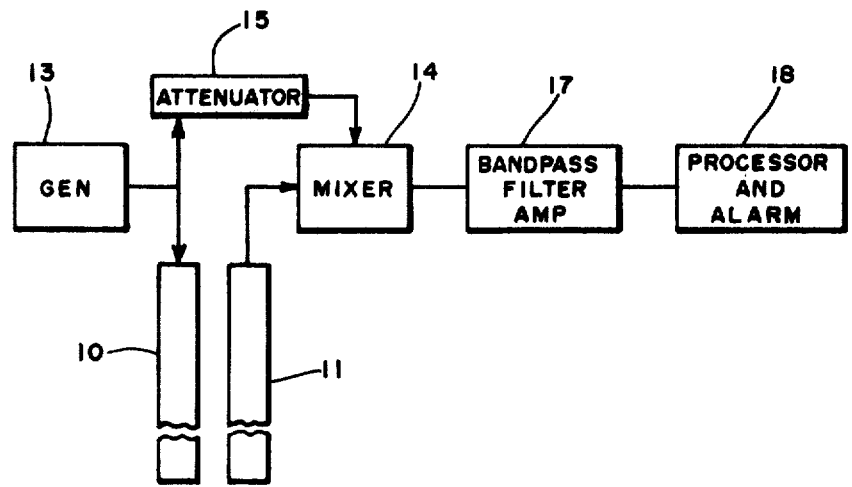
FIG. 1 is a simplified schematic block diagram of an intrusion detection system utilizing a tape transducer of the type produced in accordance with this invention.

4,023,155. A block diagram of such a system is shown in FIG. 1 and comprises electret tape transducers 10 and 11 connected to an AC generator 13 and a mixer 14, respectively. Generator 13 is an oscillator having an output frequency in the ultrasonic range such as 30 KHz and is connected by attenuator 15 to mixer 14. The output of mixer 14 is connected to bandpass filter amplifier 17 which in turn is connected to processor and alarm circuits 18. Transducer 10 functions as a transmitter and propagates ultrasonic waves generally normal to the plane of the tape. Transducer 11 is positioned to receive ultrasonic waves reflected by an object within the range of the system. The electrical output from transducer 11 is passed to mixer 14 which compares the received signal with the generator output and produces an output when there is a difference in these frequencies. This occurs as a result of a doppler shifted frequency produced by a moving object such as an intruder. The output of mixer 14 is applied to amplifier 17 and to processor and alarm circuits 18 to appropriately indicate the presence of a moving object.

Intrusion detection systems are but one application of such electret tape transducers. Other uses for such transducers are distance measurement, and position control or velocity control in industrial processes for which point transducers are unsuitable.

Figure 2:
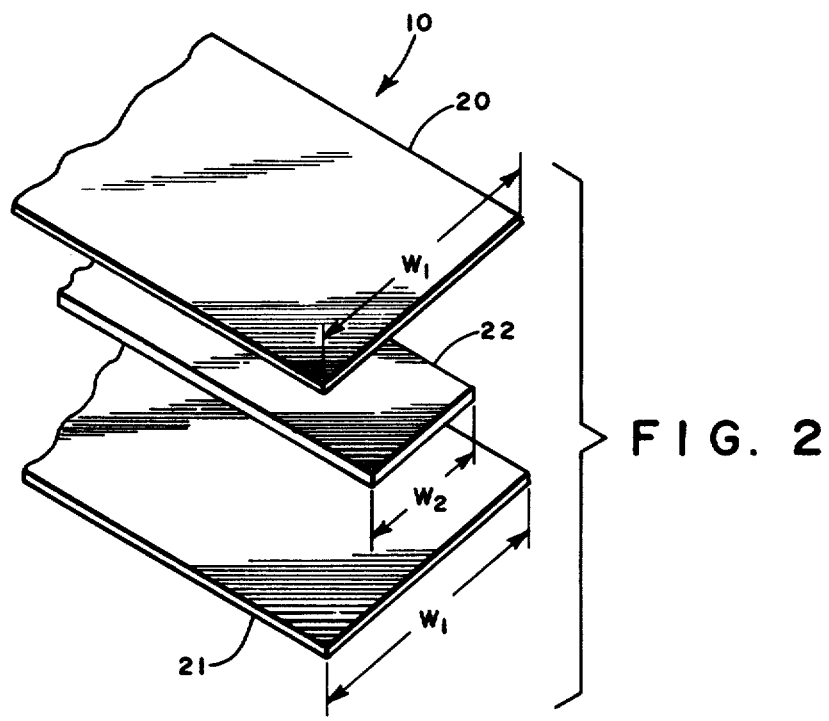
FIG. 2 is an exploded view of the tape transducer showing the three parts thereof.
Figure 3:
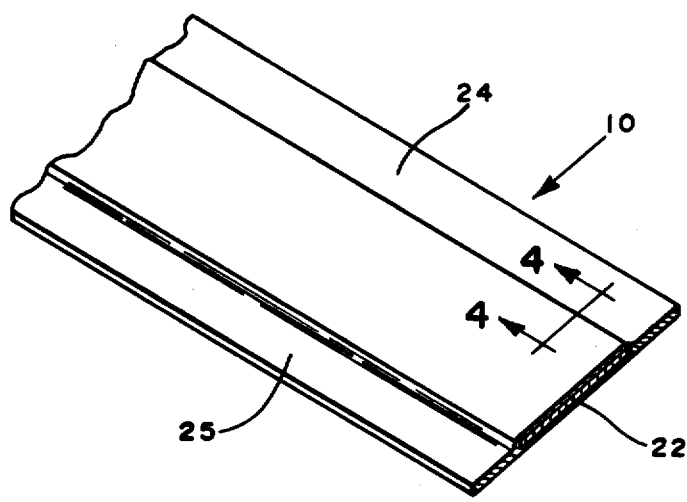
FIG. 3 is a perspective view of a finished tape transducer made in accordance with this invention.
Figure 4:
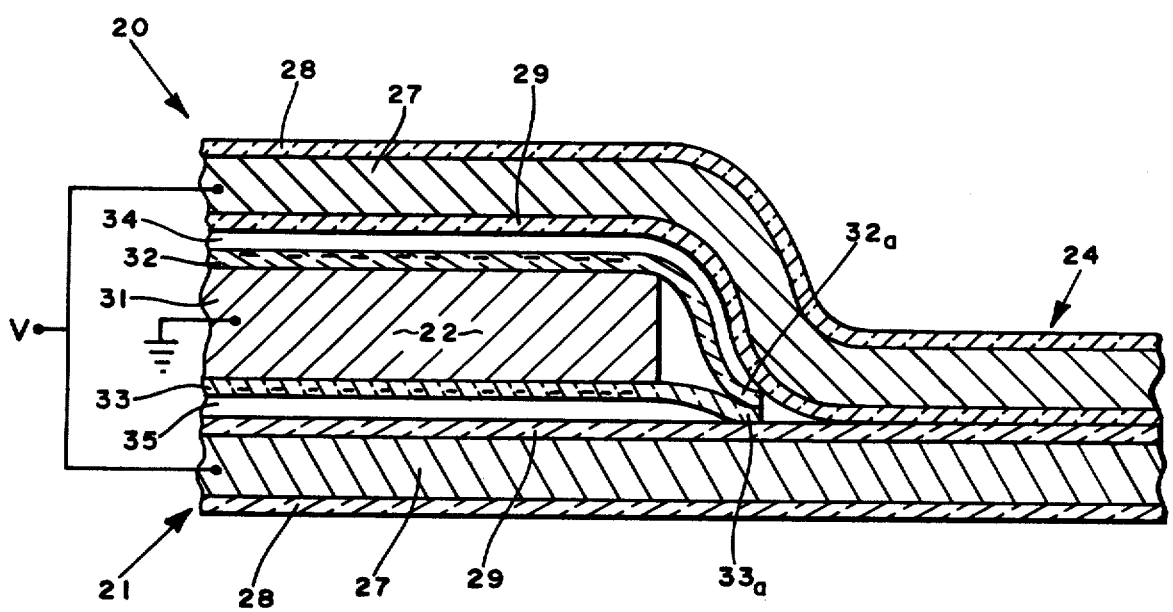
FIG. 4 is a greatly enlarged transverse section taken on line 4—4 of FIG. 3.

The tape transducer 10 with which this invention is concerned is illustrated in FIGS. 2, 3 and 4 and comprises elongated outer strip means or laminates 20 and 21 and an elongated inner strip means or laminate 22 sandwiched between the outer laminates. Outer laminates 20 and 21 have equal widths $W_1$ greater than the width $W_2$ of inner laminate 22 and are positioned symmetrically about the longitudinal axis of inner laminate 22 so that marginal edge portions 24 and 25 of the latter extend beyond the side edges of the inner laminate. The marginal edge portions 24 and 25 are secured or sealed together so that the inner laminate 22 is substantially totally enclosed by the outer laminates 20 and 21.

Outer laminates 20 and 21 are substantially identical in construction and each comprises a foil 27 of a conductor such as aluminum, a thin plastic covering 28 such as the polyester compound Mylar secured to the outer surface of foil 27 and a thin sheet 29 of a plastic compound such as polyethylene adhered to the opposite surface of foil 27. By way of example, outer laminate is approximately 0.003" thick, 1.75" wide and is marketed commercially as heat sealable Mylar tape by Lamart Corporation, Clifton, N.J.

Inner laminate 22 comprises a conductive metal strip 31 having outer surfaces covered with thin dielectric layers 32 and 33 which preferably are slightly wider than strip 31. By way of example, strip 31 is made of copper 0.007" thick and 1.0" wide, and dielectric layers (each 0.0015" thick) 32 and 33 are made of tetrafluorethylene (Teflon). Laminate 22 is sold commercially by TME Division of Chomerics Corporation, Hudson, N.H.

In the composite transducer shown in FIG. 4, the side edges 32a and 33a of dielectric layers 32 and 33, respectively, are sealed together as received from the manufacturer. In accordance with this invention, the marginal edge portions 24 and 25 of the outer laminates 20 and 21 are also sealed together around inner laminate 22 as shown to substantially totally enclose the latter. Air spaces 34 and 35 exist between inner laminate 22 and adjacent portions of outer laminates 20 and 21, respectively, so that the latter are movable relative to the inner laminate to perform the transduction function of the device.

Dielectric layers 32 and 33 are electrically charged in a manner described below so that the charges on the sides thereof remote from the inner strip 31 are the same. As shown in FIG. 4, for example, the charges remote from the strip 22 are negative. This charge distribution in combination with the symmetrical arrangement of the outer laminates 20 and 21 relative to the inner laminate 22 provide enhanced signal output from the transducer when subjected to transverse external forces applied to one or both of the outer laminates and to an enhanced radiation efficiency due to the push-pull effect of the inner laminate on the outer laminates when the latter are connected to a source of alternating voltage.

By way of example, assume the charges on the inner surfaces of electret layers 32 and 33 are minus as shown in FIG. 4. Reduction in the spacing of either or both outer foils 27 from inner strip 31 produces a signal of the same polarity, making the device sensitive to pressure. When a negative voltage V is applied to foils 27 of the outer laminates and inner strip 31 is electrically grounded, the former are pushed outwardly by the electrostatic force and when the voltage V goes positive, foils 27 are pulled inwardly. If the lower (as viewed) laminate 21 is immobile because it rests on a solid surface, then any motion produced by the lower laminate supplements motion produced by upper laminate 20. If inner strip 22 were massless, acoustic radiation produced by the transducer would be doubled. However, if strip 22 were somewhat massive, the force from below would oppose that from above so that the effective mass of inner strip 22 as seen from the active upper laminate would be greatly increased. While a requirement in prior devices was that the center conductor be massive with respect to the mass of the moving layer, the transducer described above obtains the desired effective inertia electrically by using an applied rather than a reaction force. This permits the use of a light thin center strip which is required only to be capable of conducting the driving current (when the device is used in the transmitting mode) without overheating.

The composite tape transducer described above is efficiently and continuously made by apparatus 38 illustrated schematically in FIG. 5. Apparatus 38 comprises a laminate supply station 40, an electret charging station 41, a mold or tape forming station 42, and a drive mechanism 43 which pulls the tape and its component laminates through the apparatus and delivers the finished composite transducer to a receiving station, not shown, for storage on a reel or the like. As indicated at the right as viewed in FIG. 5, the inner conductive strip 31 is electrically grounded by line 45 connected to the lead end of that strip. This is accomplished, by way of example, by baring the lead end of strip 31 and connecting it to a grounded terminal on the hub of the reel on which the finished tape transducer is wound.

Supply station 40 consists of reels 47 and 48 on which are wound substantial lengths of outer laminates 20 and 21, respectively, and a reel 49 containing a similar supply of inner laminate 22. The reels are supported on a rigid structure 50 for rotation about their respective axes against a suitable frictional drag for maintaining a desired tension in the laminates as they pass through the rest of the apparatus.

Laminate 22 moves from reel 49 to charging station 41 and more particularly passes around a first support sheave 51 and an idler sheave 52 and a second support sheave 53 of the charging station and finally to an exit roller 54. The sheaves and other parts of charging station 41 as well as mold 42 and drive mechanism 43 are mounted on a structural support member 55. Electrodes 56 and 57 are electrically connected together by line 58 and to a source of high voltage 59 by line 60 and are supported adjacent to the respective rims of sheaves 51 and 53; this enables successive electrical charging of dielectric layers 32 and 33, respectively, of inner laminate 22. It will be noted that the sheave and electrode arrangement is such that the electrodes are positioned above the support sheaves and that dielectric layers 32 and 33 on inner strip 31 reverse vertical positions in order that these layers pass under the electrodes, respectively. Electrodes 56 and 57 preferably make liquid contacts with dielectric layers 32 and 33, respectively, and to this end are connected by tubes 61 and 62 to canisters 63 and 64, respectively, each containing a conducting dielectric fluid suitable for this purpose. A fluid useful for this purpose is a mixture of reagent grade solvents ethyl alcohol, methyl alcohol and acetone. Tubes 61 and 62 deliver the fluid at a controlled gravity-feed rate via adjustable valves 65 and 66 to the electrodes 56 and 57, respectively, for charging the dielectric layers 32 and 33 and converting them into electrets.

Structural details of charging station 41 are shown in FIGS. 6 and 7. Electrodes 56 and 57 are mounted on insulating blocks 67 and 68, respectively, secured to a vertical plate 69 which is supported on a position adjustment device 70 that permits vertical and lateral adjustment of electrodes relative to the sheaves 51 and 53. The electrodes are substantially identical, each comprising an inverted U-shaped electrically conductive clip 72 which holds the upper portion of a sponge-like contact 73 that extends from the lower open end of the clip adjacent to the dielectric layer on inner laminate 22. Clip 72 is electrically connected to power line 58 (or 60) by a downwardly extending connector 75, the upper end of which has an opening 76 through which extends the lower end of tube 61 (or 62) from the associated dielectric fluid canister. As dielectric fluid drips from the lower ends of these tubes as shown, at a rate controlled by valves 65 and 66, respectively, each connector 75 directs the fluid to sponge 73 to maintain it in a moistened condition. The high DC voltage is applied by this fluid across the dielectric layer of the laminate and electrically charges the latter which remains permanently charged.

Each of sheaves 51, 52 and 53 is formed from an electrical insulating material such as a polyethylene compound known as "UHMW" (ultra high molecular weight), each having a rim with shoulders 51a and 51b, see FIG. 7, spaced approximately the width $W_2$ of inner laminate 22 for centering it. Each of these sheaves also has grooves 51c and 51d formed adjacent to the shoulders to drain excess fluid that may collect on the sheave.

The DC voltage connected to these electrodes from supply 59 is applied successively across the dielectric layers 32 and 33 on each side of inner laminate 22 as the latter move continuously through the charging station. By way of example, a charging voltage of $-1200$ volts DC applied with the above dielectric fluid across 0.0015" Teflon layer on a 0.007" thick copper inner strip moving at a rate of 50 centimeters per minute produced electrets having a surface potential of $-500$ volts which gave satisfactory results.

Outer laminates 20 and 21 pass from reels 47 and 48, respectively, over sheaves 77, see FIGS. 5 and 8, on opposite sides of and converging toward inner laminate 22 as these three laminates enter mold 42. Sheaves 77 preferably are composed of a synthetic material marketed under the trademark DELRIN by E. I. Dupont de Nemours and each has a rim defined by shoulders 77a and 77b spaced apart by a distance slightly greater than the width $W_1$ of the outer laminates.

Figure 9:
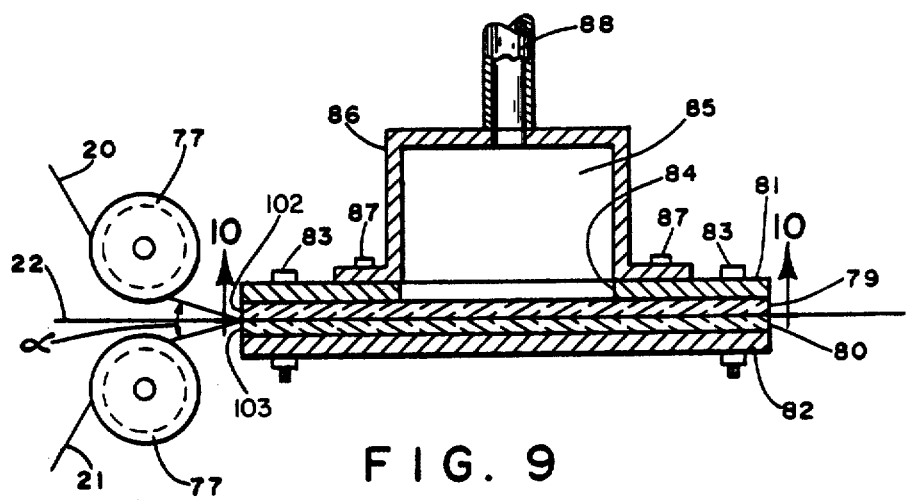
FIG. 9 is a longitudinal section of the transducer mold taken on line 9—9 of FIG. 10.
Figures 10, 11, 12:
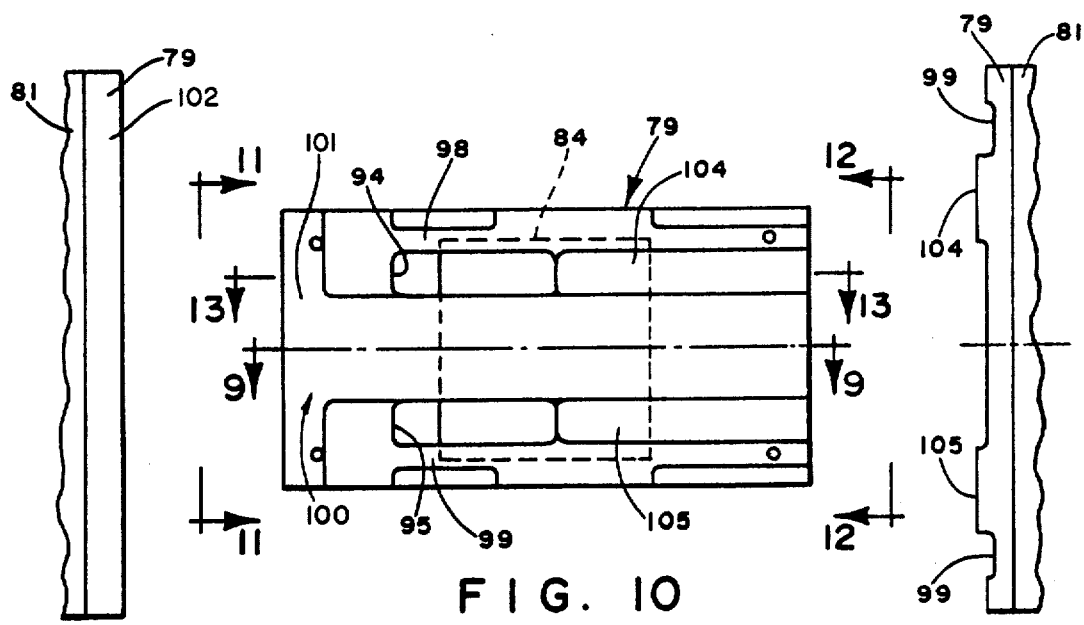
FIG. 10 is a bottom view of the strip laminate-engaging face of the mold as viewed on line 10—10 of FIG. 9.
FIGS. 11 and 12 are enlarged end views of the laminate engaging plates of the mold as viewed on lines 11—11 and 12—12, respectively, of FIG. 10.

Mold 42 comprises a pair of die plates 79 and 80, see FIG. 9, preferably made of Teflon, pressed together between backing plates 81 and 82, respectively, which are secured by bolts 83. Upper plate 81 has an opening 84 which communicates with a plenum 85 defined by a housing 86 secured to upper plate 81 by bolts 87. Housing 86 is connected by pipe 88 to a heater 90, see FIG. 5, through which air is blown by a blower 91 and an interconnecting conduit 92. Thus hot air is introduced to plenum 85 and is applied directly to upper die plate 79 for heating it. In addition, plate 79 is formed with openings 94 and 95, see FIGS. 10 and 13, which communicate with plenum 85, through an opening 84 in backing plate 81. Thus, as the transducer laminates pass through the mold, hot air from heater 90 is applied directly against upper laminate 20 and more particularly against the marginal edge portions 24 and 25 of upper laminate 20.

Lower die plate 80 has a plane upper or mating surface over which lower laminate 21 passes. The opposed mating surface of upper die plate 79 is formed to distribute the hot air directly against upper laminate 20 and over a substantial area of plate 79 and to this end is formed with channels 98 and 99 which extend substantially the full length of the plate and on both sides of the central portion 100 thereof.

The central portion 100 of the upper die plate 79 is slightly wider than the width $W_2$ of inner laminate 22 and has a flat surface that is parallel to the adjacent face of the lower die plate 80. The front edge portion 101 of the die plate 79 similarly is flat and lies in the same plane as surface 100. The front (left as viewed) faces 102 and 103 of upper and lower die plates 79 and 80, respectively, are formed at right angles to the planes of the mating surfaces of the die plates, respectively, and thus define with those mating surfaces edges over which outer laminates 20 and 21 are drawn as the latter enter the mold. Sheaves 77 adjacent to the mold are positioned with respect to each other and to the mold to cause outer laminates 20 and 21 to converge at an angle $\alpha$ upon entering the mold so the front edges of the die plates contact these laminates to stretch them and push them against inner laminate 22.

Figure 13:
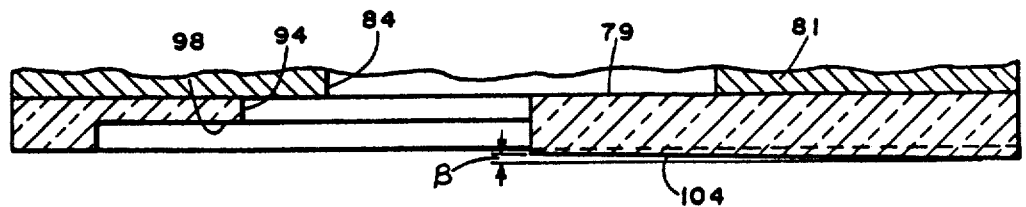
FIG. 13 is an enlarged longitudinal section of the laminate engaging plate taken on line 13—13 of FIG. 10.

Adjacent to central portion 100 of die plate 79 and immediately behind (to the right as viewed in FIG. 10) openings 94 and 95 are shoes 104 and 105, respectively, which overlie marginal edge portions 24 and 25 of outer laminates 20 and 21 as they move through the mold. The surfaces of shoes 104 and 105 are parallel to each other and incline downwardly to the rear from the plane of surface of central portion 100 at an angle $\beta$ as shown in FIG. 13. This produces an increasing force on the marginal edge portions of the outer laminates as they move to the rear of the mold and permanently heat seals them together.

In operation, outer laminates 20 and 21 enter the front of the mold and are drawn over the front edges of die plates 79 and 80, respectively, at slight angles to stretch them and press them together between die plates 79 and 80. As the three laminates progress rearwardly through the mold, they heat up rapidly due to direct exposure to hot air issuing from openings 94 and 95 and because of thermal conduction through die block 79. This heat and tension on the laminates cause them to expand slightly but uniformly across the surface of the blocks. This occurs because the blocks, preferably made of Teflon, offer virtually no resistance to the heat-induced spreading and because the edges of the marginal edge portions of the outer laminates have not yet been pushed together.

The final sealing action takes place at the rear end of the die plates when shoes 104 and 105 force the heat-sensitive plastic layers 29 of the outer laminates together. Outer laminates 20 and 21, however, are not sealed to inner laminate 22 because of the lateral spacing of shoes 104 and 105. Thus air spaces 34 and 35 continue to exist between outer laminates 20 and 21, respectively, and inner laminate 22, so that the former are free to move outwardly and inwardly relative to the inner laminate. The sealing of the marginal edge portions 24 and 25 of the outer laminates essentially totally encloses inner laminate 22 so as to provide desired elctromagnetic shielding of conductive strip 31 and otherwise protectively cover the assembly.

The completed tape transducer exits from mold 42 and is engaged by tape driving mechanism 43 which pulls the inner and outer laminates from their reels, draws the inner laminate through the charging station and the three laminates through the mold while maintaining them longitudinally taut. In order to achieve this pulling action without damaging the completed tape transducer, driving mechanism 43 comprises a pair of laterally spaced longitudinally elongated endless belts 107 and 108, see FIGS. 14 and 15, which frictionally engage the marginal edge portions 24 and 25, respectively, of the transducer. Belts 107 and 108 are wrapped around and frictionally engage a drive drum 109 and an idler drum 110 logitudinally spaced from the latter. A motor 111, see FIG. 5, operatively connected to a sprocket 112 drives a chain 113 connected to a sprocket, not shown, on drive shaft 114 of drum 109. In other respects, drums 109 and 110 are substantially identical in construction. Longitudinally extending bars 116 and 117 space the shafts of drums 109 and 110 which are journalled in and supported by member 55.

Belts 107 and 108 preferably have a circular cross section and ride in similarly shaped laterally spaced grooves 119 and 120, respectively, formed in the drum surfaces, the lateral spacings of these grooves being greater than the width $W_2$ of inner laminate 22 but less than the width $W_1$ of outerlaminates 20 and 21. Thus belts 107 and 108 are positioned to engage only the marginal edge portions 24 and 25, respectively, of the adjacent one of outer laminates 20 and 21 and to avoid applying forces directly to the central or active part of the transducer.

In order to provide desired frictional engagement between belts 107 and 108 and tape transducer indicated at 10, a jig 122 is supported between drums 109 and 110 symmetrically around the upper reaches of the belts as well as the tape transducer. Jig 122 comprises upper and lower plates 124 and 125 resiliently secured together by spring loaded bolts 126, and anti-friction bearing plates 127 and 128, preferably made of Teflon, secured to plates 124 and 125, respectively, and vertically spaced apart to receive belts 107 and 108 and the tape transducer. Lower plate 125 is supported on bars 116 and 117. Upper bearing plate 127 has a central recess 129 to provide clearance for the central portion of the transducer and lower plate 128 has grooves 131 and 132 for seating belts 107 and 108, respectively, in vertical alignment with the marginal edge portions 24 and 25 of the transducer. By adjustment of bolts 126, the desired frictional engagement between belts 107/108 and the marginal edge portions of the transducer is achieved for drawing the transducer and its components through various stations of the apparatus. The dimension of plates 127 and 128 in the direction of transducer movement is sufficient to significantly reduce the unit force applied to the transducer by the belts to prevent damage to the latter while applying a total force to it sufficient to move the transducer through the apparatus.

Figure 14:
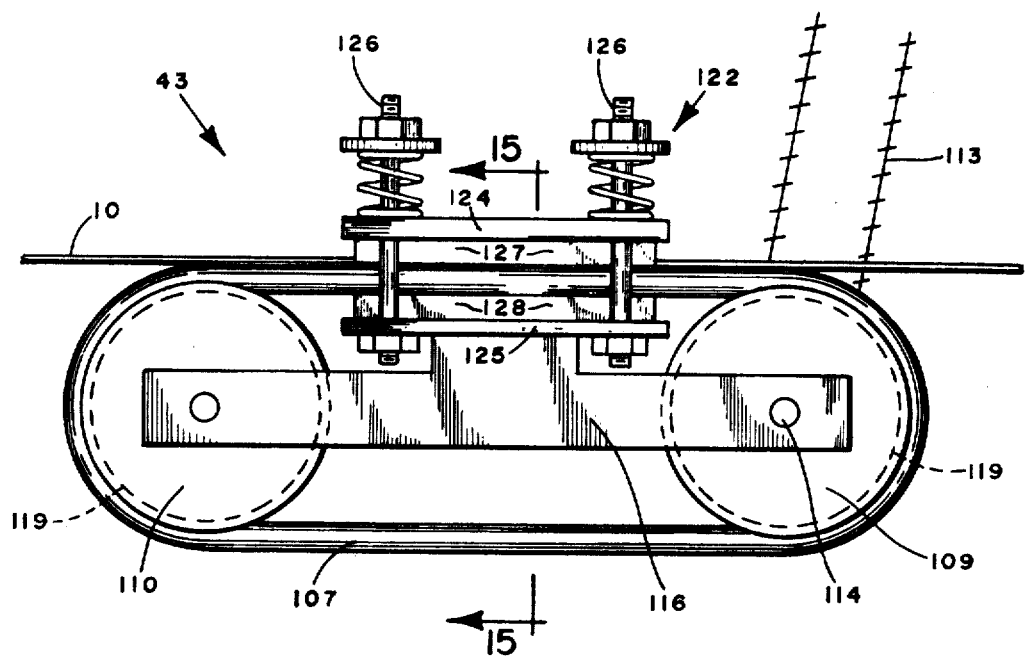
FIG. 14 is an enlarged schematic elevational view of the tape driving mechanism.
Figure 15:
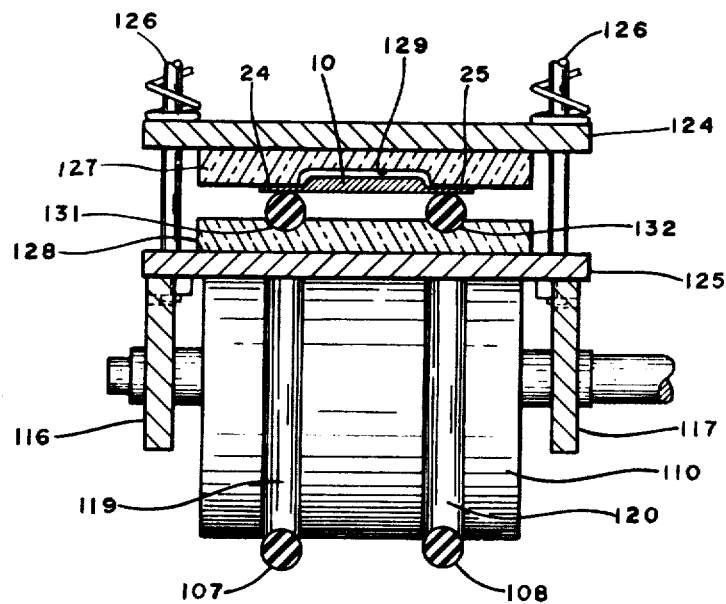
FIG. 15 is a transverse section taken on line 15—15 of FIG. 14.

The tape transducer moves continuously to the right as viewed in FIG. 14 out of driving mechanism 43 and is stored, preferably on a reel (not shown), from which it is available for use in various systems for selected applications.

What is claimed is:

1. A method of making a composite tape transducer comprising an inner strip means having an elongated electrically conductive inner strip and dielectric layers on opposite sides of the inner strip, thereof and a pair of electrically conductive outer strips having widths larger than the width of said inner strip consisting of the steps of
    electrically grounding said inner strip,
    moving the inner strip means relative to first and second electrodes with one of said dielectric layers adjacent in electrical contact with the first electrode and the other of said layers in electrical contact with the second electrode,
    continuously applying a DC voltage across said electrodes and said inner strip whereby to electrically charge said dielectric layers,
    moving said outer strips into engagement with opposite sides, respectively, of said inner strip means, and
    sealing marginal edge portions of said outer strips together.

2. The method according to claim 1 with the additional steps of heating said outer strips when in contact with said inner strip means and
    forcing the marginal edge portions of the outer strips together while heated.

3. The method according to claim 2 including longitudinally stretching said outer strips immediately prior to engagement with said inner strip means and
    maintaining uniform pressure between the central portion of the outer strips and said inner strip means and simultaneously increasing the force between the marginal edge portions of the outer strips.

4. The method according to claim 1 in which said dielectric layers are charged to have charges with the same polarity on the sides remote from said inner strip.

* * * * *